United States Patent [19]

Hunter et al.

[11] Patent Number: 5,280,254
[45] Date of Patent: Jan. 18, 1994

[54] CONNECTOR ASSEMBLY

[75] Inventors: Tracy A. Hunter, Canoga Park; Jose Silva, Reseda, both of Calif.

[73] Assignee: Trompeter Electronics, Inc., Westlake Village, Calif.

[21] Appl. No.: 852,393

[22] Filed: Mar. 16, 1992

[51] Int. Cl.[5] .............................................. H01P 1/10
[52] U.S. Cl. ................................. 333/124; 333/127; 333/22 R; 439/188; 200/51.09
[58] Field of Search .................... 439/188; 200/51.05, 200/51.09, 51.1, 51.11; 333/22 R, 124, 127

[56] References Cited

U.S. PATENT DOCUMENTS 4,815,104 3/1989 Williams et al. ...................... 375/36

OTHER PUBLICATIONS

Drawing No. 1000-0125 by Trompeter Electronics, Inc.
"Coax Patching" sales literature of Trompeter Electronics, Inc.
Drawing No. 1000-0100 by Trompeter Electronics, Inc.
"Coax Patching Introduction & Standard Patch Jacks" sales literature of Trompeter Electronics, Inc.

Primary Examiner—Gary F. Paumen
Attorney, Agent, or Firm—Ellsworth R. Roston; Charles H. Schwartz

[57] ABSTRACT

A connector assembly includes first and second conductive probes, first and second conductive shields respectively enveloping the first and second probes in an insulated relationship and a cover insulatingly enveloping the shields. First and second barrels may be disposed within the cover at a first axial end of the cover. Third and fourth barrels may be disposed within the cover, at the opposite axial end of the cover in enveloping relationship to respective ones of the shields. An assembly including an impedance is insulatingly supported by the third and fourth barrels. An actuator assembly insulatingly supported by the first and second barrels has (a) a first operative relationship establishing electrical continuity between the probes and between the shields and (b) a second operative relationship interrupting such continuities and establishing a circuit including an individual one of the probes, the impedance and the corresponding one of the shields. The actuator assembly includes first and second actuators having a fixed and insulating relationship to each other. Each actuator is fixedly attached to the barrels at an intermediate position to define first and second resilient arms. The arms on each individual end of the actuators are constructed to engage the opposite ends of the impedance when the arms at that end are actuated to the second operative relationship, this occurring when a plug is inserted into a particular one of the first and second barrels. Insulators on the arms insulate the arms from the plug.

22 Claims, 4 Drawing Sheets

CONNECTOR ASSEMBLY

This invention relates to an electrical connector assembly including a pair of connectors. More particularly, the invention relates to an electrical connector assembly in which each of the connectors includes a probe and an enveloping shield and in which an electrical continuity is established (a) in a first operative relationship between the probes and between the shields and (b) in a second operative relationship by the probe and the shield of an individual one of the connectors to the opposite ends of an impedance.

Electrical connectors have been in existence for decades. They are used to provide a continuity bridge between different circuits. When the connectors are coaxial, they generally include a centrally disposed probe and a shield in concentric and enveloping relationship to the probe. Signals are generally introduced to the probe and the shield is provided with a reference potential such as ground.

Since electrical connectors constitute basic components in electrical systems and electrical equipments, many different types of connectors have been provided through the years. For example, a connector assembly has been provided with a pair of connectors disposed in a cover. Each of the connectors has included a probe, a shield enveloping the probe in insulating relationship to the probe and a barrel enveloping the shield in insulating relationship to the shield. An actuator has been movable to a first position connecting the probes or to a second position disconnecting the probes.

It has been desired for some time to extend the scope of operation of a connector assembly constructed as described in the previous paragraph. For example, it has been desired to provide a connector assembly with two (2) connectors such as described in the previous paragraph where an electrical continuity is established between the two (2) connectors in a first position of actuators associated with the connectors and where an electrical continuity is established between individual ones of the connectors and an impedance in a second position of the actuators. Until now, no one has been able to provide such a connector assembly in spite of considerable effort, and significant expenditures of money, to accomplish this.

In one embodiment of the invention, a connector assembly includes first and second conductive probes, first and second conductive shields respectively enveloping the first and second probes in an insulated relationship and a cover insulatingly enveloping the shields. First and second barrels may be disposed within the cover at a first axial end of the cover. Third and fourth barrels may be disposed within the cover at the opposite axial end of the cover in enveloping relationship to respective ones of the shields.

An assembly including an impedance is insulatingly supported by the third and fourth barrels. An actuator assembly insulatingly supported by the first and second barrels has (a) a first operative relationship establishing electrical continuity between the probes and between the shields and (b) a second operative relationship interrupting such continuities and establishing a circuit including an individual one of the probes, the impedance and the corresponding one of the shields.

The actuator assembly includes first and second actuators having a fixed and insulating relationship to each other. Each actuator is fixedly attached to the barrels at an intermediate position to define first and second resilient arms. The arms on each individual end of the actuators are constructed to engage the opposite ends of the impedance when the arms at that end are actuated, this occurring when a plug is inserted into a particular one of the first and second barrels. Insulators on the arms insulate the arms from the plug.

Figure 2:
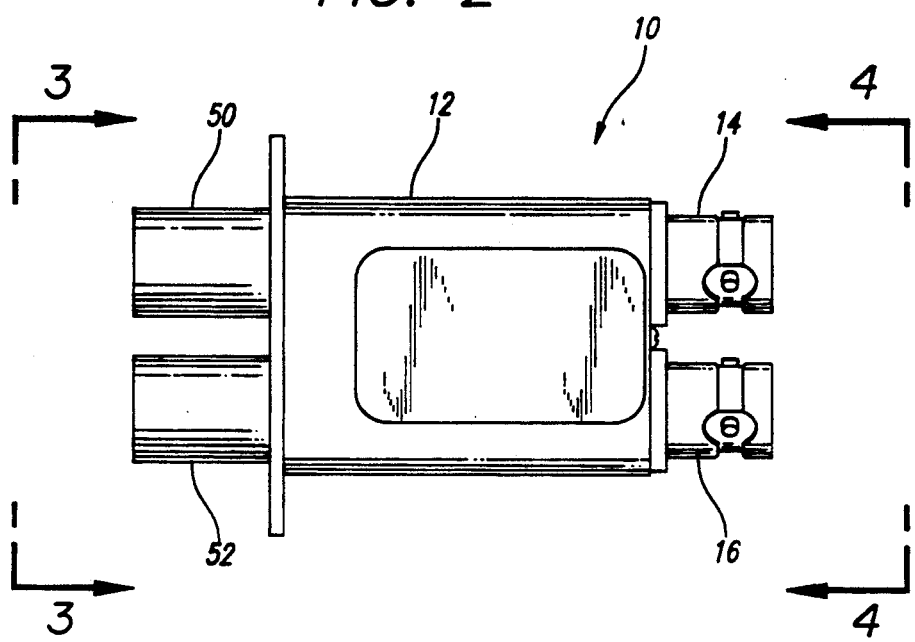
FIG. 2 is a front elevational view of the connector assembly constituting one embodiment of the invention.

In one embodiment of the invention, a connector assembly generally indicated at 10 (FIGS. 1-7) is provided. The connector assembly 10 includes a hollow cover 12, preferably annular, made from a suitably conductive material. The cover 12 is shaped at one axial end to define a pair of barrels 14 and 16 (FIGS. 2, 4 and 5), preferably annular, made from an electrically conductive material and suitably separated from each other.

Shields 18 and 20 (FIGS. 4 and 5) made from a suitably conductive material are respectively disposed in the barrels 14 and 16 in concentric relationship with the barrels. The shields may be respectively insulated electrically from the barrels 14 and 16 as by insulators 22 and 24. Openings 26 and 28 may be respectively provided in the shields 18 and 20 and the insulators 22 and 24 near the axial inner ends of the shields.

Electrically conductive probes 30 and 32 are disposed within the shields 18 and 20 in concentric relationship with the shields. The probes 30 and 32 are respectively insulated from the shields 18 and 20 as by insulators 34 and 36. The insulators 34 and 36 are open as at 38 and 40 at positions adjacent the openings 26 and 28 in the shields 18 and 20. In this way, the probes 30 and 32 are exposed at the positions of the openings 34 and 36.

An insulator 42 is disposed between the barrels 14 and 16 in fixed relationship to the barrels. An impedance assembly 44 is attached to the insulator 42 as by a screw 46 which extends into a threaded socket in the insulator 42. An impedance 48 (FIG. 1), preferably a resistor, is suitably supported by the combination of the insulator 42 and the screw 46. The impedance 48 extends in a direction transverse, preferably perpendicular, to the axial direction of the barrels 14 and 16.

Figure 1:
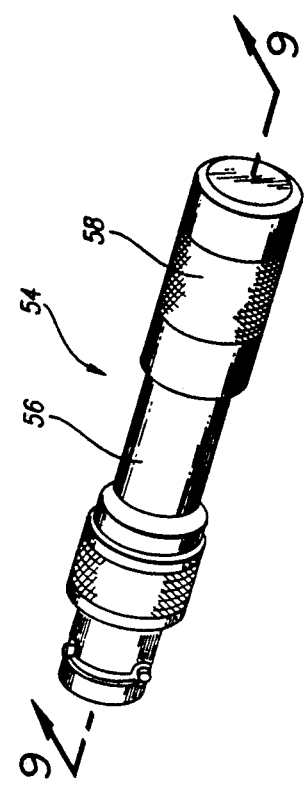
FIG. 1 is a schematic diagram showing the electrical continuities established in an electrical connector assembly constituting one embodiment of the invention when the connector assembly is operated in different relationships.
Figure 8:
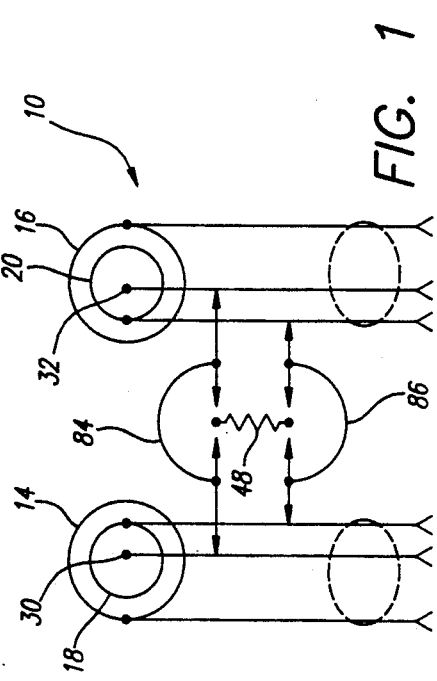
FIG. 8 is a perspective view of a plug for actuating the actuators of FIGS. 6 and 7 to obtain an operation of the connector assembly in the different relationships.
Figure 9:
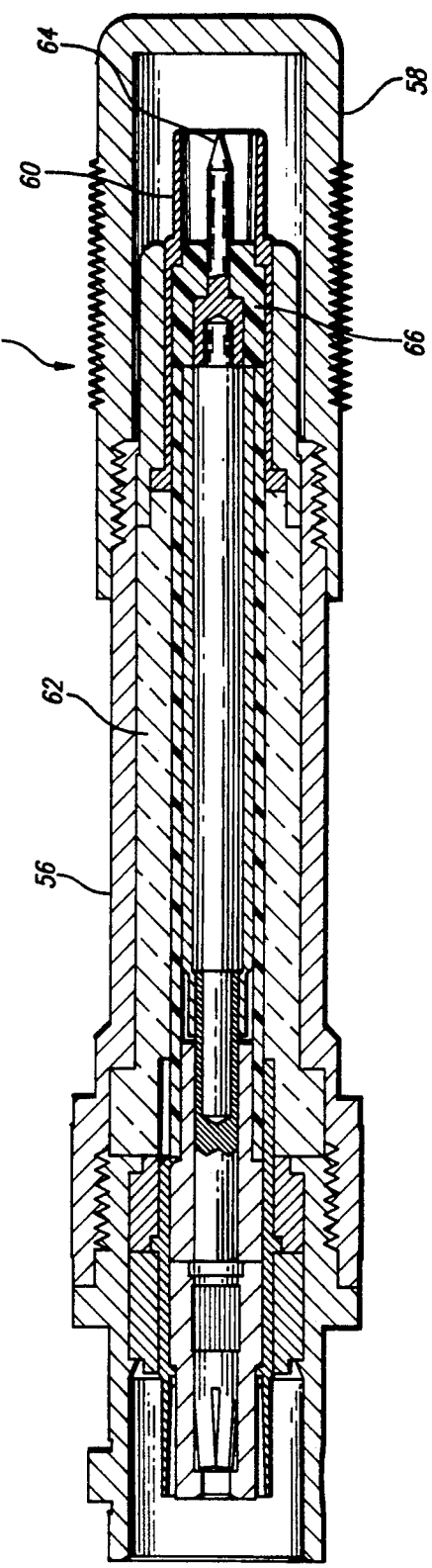
FIG. 9 is an enlarged sectional view of the plug shown in FIG. 8 and is taken substantially on the line 9—9 of FIG. 8.

Barrels 50 and 52 preferably made from an electrically conductive material are disposed at the opposite axial end of the cover 12 from the barrels 14 and 16. The barrels 50 and 52 are constructed to removably receive a plug generally indicated at 54 (FIGS. 8 and 9). The plug 54 includes cover 56, preferably annular, made from an electrically conductive material. The cover 56 is provided with a diameter to fit snugly in each of the barrels 50 and 52. The cover 56 is threaded to receive a cap 58 which is removable from the cover before the plug 54 is removably inserted into either of the barrels 50 and 52.

A shield 60 made from an electrically conductive material is disposed within the cover 56 in concentric relationship with the cover. An insulator 62 is disposed between the shield 60 and the cover 56 to isolate the shield electrically from the cover. A probe 64 is disposed within the shield 60 in concentric relationship with the shield and is isolated electrically from the shield as by from an insulator 66 disposed between the shield and the probe.

An actuator assembly generally indicated at 70 (FIG. 5) is fixedly supported by the barrels 50 and 52 within the cover 12 at a position interior to the barrels. The actuator assembly 70 includes an insulator 72 threadedly supported by the barrels 50 and 52 at a position between the barrels. A screw 74 threadedly extending through the insulator 72 holds an insulator 76 and a pair of actuators 78 and 80 which respectively have holes 82 (FIG. 7) and 84 (FIG. 6) for slidable disposition of the actuators on the screw. A nut 83 preferably made from an insulating material is threadedly tightened on the screw 74 to hold the actuators 78 and 80 in fixed disposition on the screw. The holes 82 and 84 are respectively disposed at intermediate positions on the actuators 78 and 80.

The actuators 78 and 80 are made from a suitably resilient or springlike material. The actuator 78 is provided with a pair of arms 78a and 78b (FIG. 7) which extend in a winged configuration in opposite directions from a central portion in which the hole 82 is provided. Similarly, the actuator 80 is provided with a pair of arms 80a and 80b (FIG. 6) which extend in a winged configuration in opposite directions from a central portion in which the hole 84 is provided.

The arms 78a and 80a are retained in fixed and electrically isolated relationship to each other by an insulator 86 (FIG. 5) disposed between the arms. An insulating button 88 is disposed on the arms 80a at a position external to the arms 78a and 80a. In like manner, the arms 78b and 80b are retained in fixed and electrically isolated relationship to each other by an insulator 90 disposed between the arms. An insulating button 92 is disposed on the arm 80b at a position external to the arms 78b and 80b.

The ends of the arms 78a and 78b are respectively flared as at 78c and 78d (FIG. 7) to engage the probes 30 and 32 in the normal disposition of the arms. The flared ends 78c and 78d of the arms 78a and 78b are shaped to engage the upper end of the impedance 48 (FIG. 1) when the arms 78a and 78b are respectively moved by the plug 54. The outer ends of the arms 80a and 80b are respectively flared slightly as at 80c and 80d (FIG. 6) to engage the shields 18 and 20 in the normal disposition of the arms. The flared ends 80c and 80d of the arms 80a and 80b are shaped to engage the lower end of the impedance 48 (FIG. 1) when the arms 80a and 80b are respectively moved by the plug 54.

As will be seen, the flared end 78c is at one lateral end of the arm 78a and the flared end 80c is at the opposite lateral end of the arm 80a. This causes the flared end 78c to engage one end of the impedance 78 and the flared end 80c to engage the other end of the impedance 48 when the impedance is considered as extending into the plane of the paper in FIG. 5 and the arms 78a and 80a are actuated by the plug 54. In like manner, the flared end 78d is at one lateral end of the arm 78b and the flared end 80d is at the opposite lateral end of the arm 80b so that the flared ends 78d and 80d engage the opposite ends of the impedance 48 when the arms 78b and 80b are actuated by the plug 54.

When the arms 78a and 78b on the actuator 78 and the arms 80 and 80b on the actuator 80 are in their normal positions, the arms 78a and 78b respectively engage the probes 30 and 32. This is indicated at A in FIG. 1. Similarly, the arms 80a and 80b respectively engage the shields 18 and 20. This is indicated at B in FIG. 1. This causes an electrical continuity to be established between the probes, and between the shields, of the two (2) connectors disposed within the cover 12.

Figure 3:
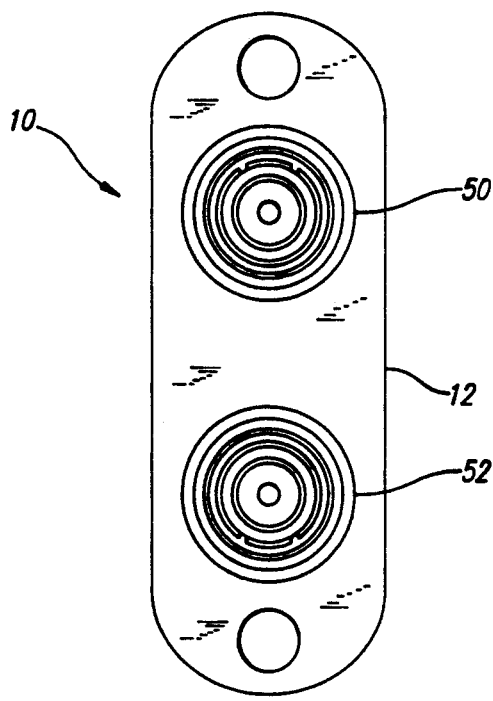
FIG. 3 is a side elevational view of the connector assembly and is taken substantially on the line 3—3 of FIG. 2.
Figure 4:
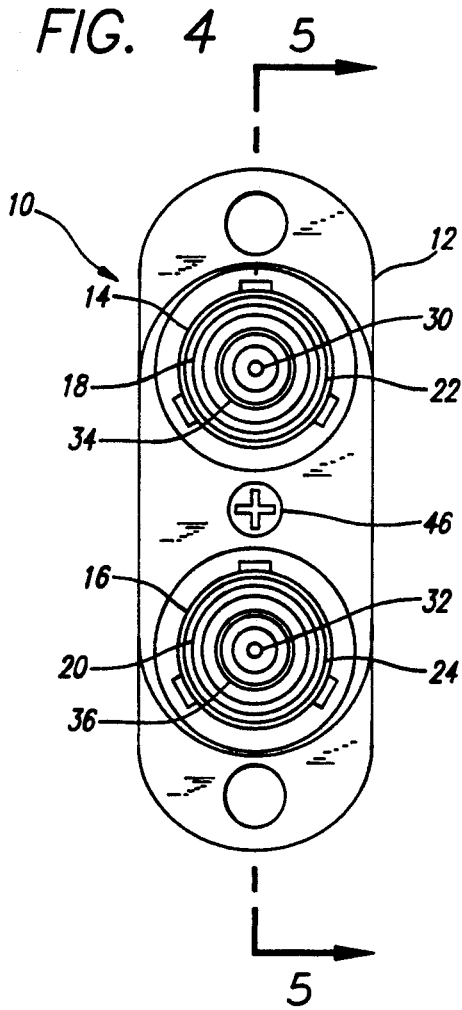
FIG. 4 is another side elevational view of the connector assembly and is taken substantially on the line 4—4 of FIG. 2.
Figure 5:
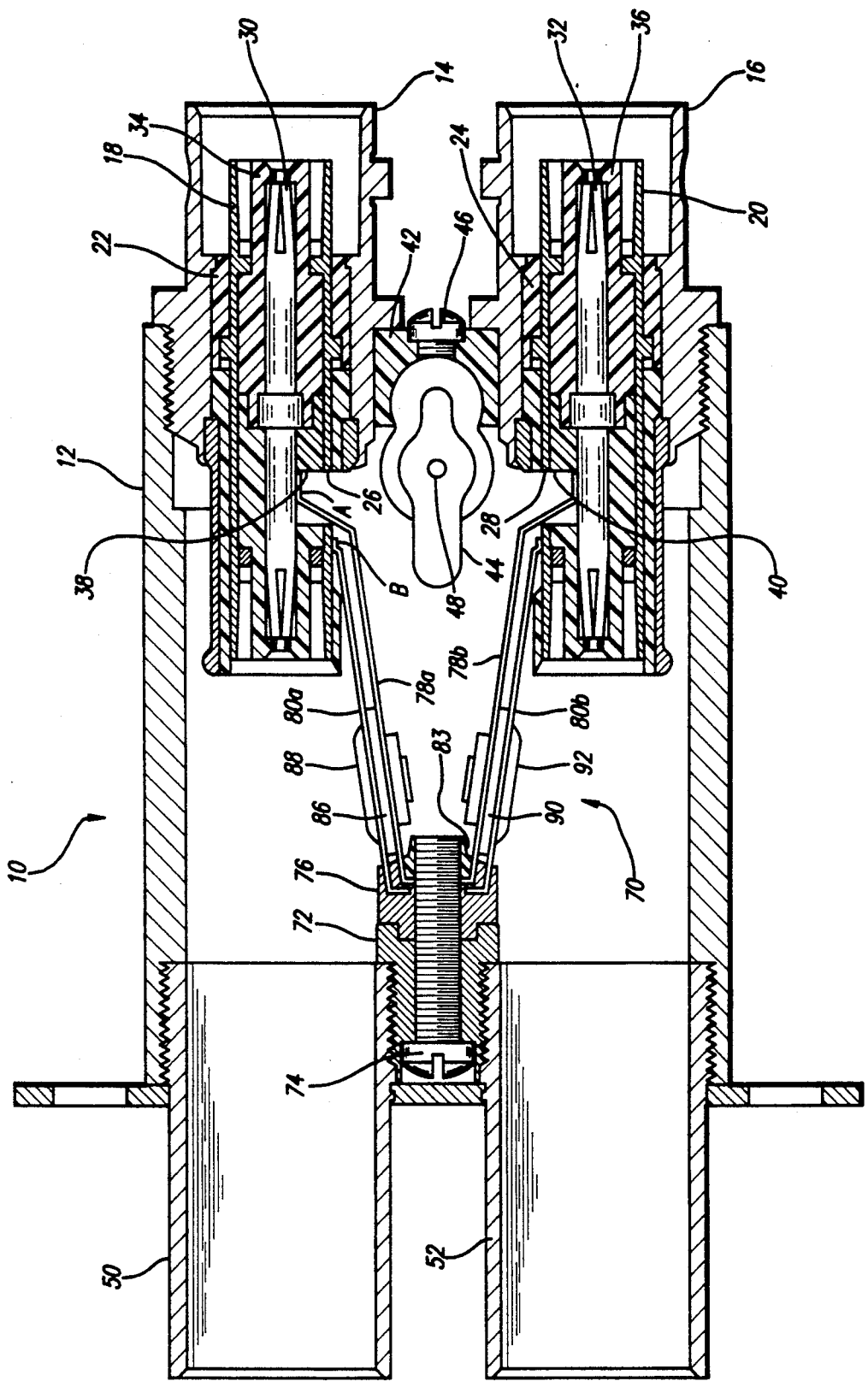
FIG. 5 is an enlarged sectional view of the connector assembly and is taken substantially on the line 5—5 of FIG. 4.
Figure 6:
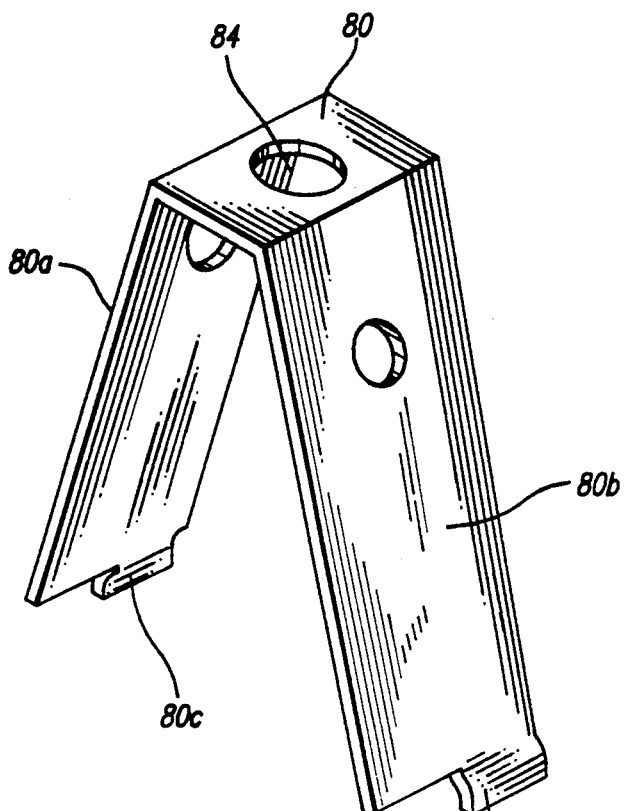
FIG. 6 is an enlarged perspective view of an actuator included in the connector assembly for establishing electrical continuity to certain components in the connector assembly in accordance with the operation of the connector assembly in the different relationships.
Figure 7:
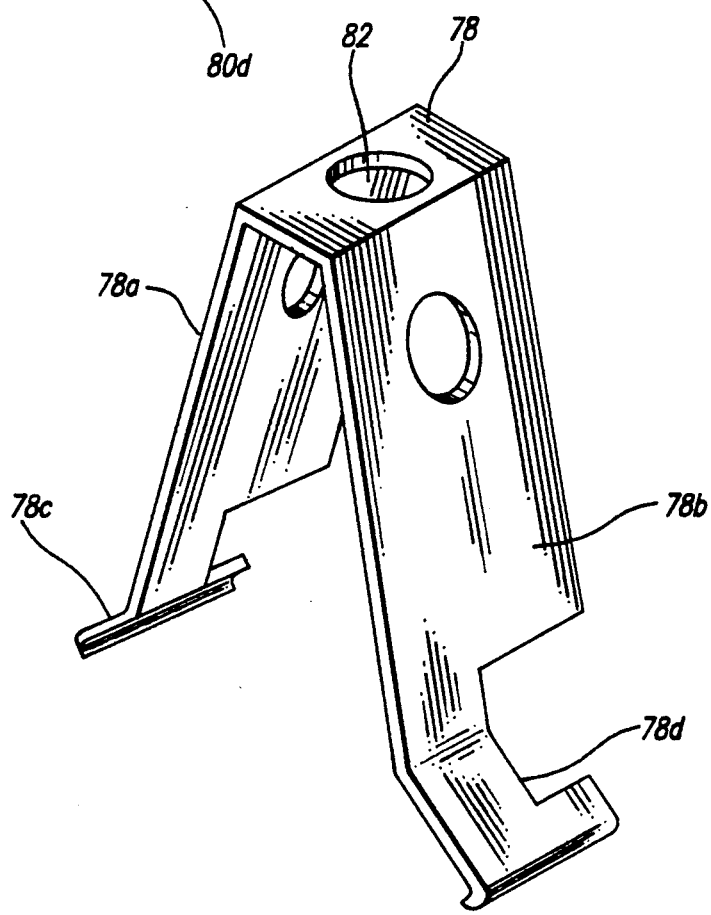
FIG. 7 is an enlarged perspective view of another actuator included in the connector assembly for establishing electrical continuity to other components in the connector assembly in accordance with the operation of the connector assembly in the different relationships.

When it is desired to establish an electrical continuity between an individual one of the connectors and the impedance 48, the cap 58 (FIGS. 8 and 9) is removed from the cover 56 of the plug 54. The plug 54 is then inserted into an individual one of the barrels 50 and 52 (FIGS. 3 and 5). For example, the plug may be inserted into the barrel 50 to engage the insulator 88. This causes the arms 78a and 80a to be moved from engagement with the shield 18 and the probe 30. The arms 78a and 80a are moved by the plug 54 to positions establishing continuity with the opposite ends of the impedance 48. This causes an electrical circuit to be established from the probe 32 through the arm 78b, the impedance 48, the arm 80b and the shield 20. In like manner, an electrical circuit is established from the probe 30 through the arm 78a, the impedance 48, the arm 80a and the shield 18 when the plug is inserted into the barrel to engage the insulator 92.

The connector assembly 10 has certain important advantages. In one operative relationship, it provides an electrical continuity between the probes 18 and 20 and the shields 30 and 32 of two separate connectors disposed within the connector assembly 10. In a second operative relationship, it establishes an electrical continuity between the probe and shield of either of the connectors and the impedance 48 shown in FIG. 1. This second operative relationship is established by the insertion of the plug 54 (with the cap 58 removed) into one of the barrels 50 and 52. When the plug 54 is removed from the barrels 50 and 52, the connector assembly returns to the first operative relationship.

The connector assembly 10 has other important advantages. It provides an arrangement in which all of the components are disposed within the cover 12 so that they are shielded from any damage by external forces. It also provides an arrangement in which a positive operation of the connector assembly in the different operative relationships is assured. It further provides an arrangement which is compact and which provides a minimal number of parts, considering the different operative relationships provided for the connector assembly.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

We claim:

1. In combination in a connector assembly,
   a first connector including a first probe, a first shield insulated from and enclosing the first probe and a cover insulated from the first shield and at least partially enclosing the first shield,
   a second connector including a second probe, a second shield insulated from and enclosing the second probe and the cover insulated from the second shield and at least partially enclosing the second shield,
   impedance means disposed within and fixedly coupled to the cover in insulated relationship to the cover for providing a particular impedance value, and
   actuator means having springlike properties and disposed within and fixedly coupled to the cover in insulated relationship to the cover and movable between a first position providing a continuity between the first and second probes and between the first and second shields while maintaining the probes in insulated relationship to the shields and a second position connecting the impedance means between the probe and the shield on an individual one of the connectors.

2. In a connector assembly as set forth in claim 1, the actuator means including a first actuator having springlike and electrically conductive properties and disposed in the first relationship in electrical continuity with the first and second probes and movable to the second position in electrical continuity with a first end of the impedance means and with the probe in the individual one of the connectors and including a second actuator having springlike and electrically conductive properties and disposed in the first relationship in electrical continuity with the first and second shields and movable to the second position in electrical continuity with the other end of the impedance means and with the shield in the individual one of the connectors.

3. In a connector assembly as set forth in claim 2, the first actuator respectively including first and second arms respectively establishing electrical continuity with the first and second probes in the first position of the first actuator, each of the arms in the first actuator being movable individually to the second position in electrical continuity with the first end of the impedance means,
   the second actuator respectively including first and second arms respectively establishing electrical continuity with the first and second shields in the first position of the second actuator, each of the arms in the second actuator being individually movable to the second position in electrical continuity with the other end of the impedance means.

4. In a connector assembly as set forth in claim 3, each of the arms in the first and second actuators being movable in a first plane,
   the impedance means including an impedance disposed in a direction transverse to the first plane to establish electrical continuity with the first actuator at the first end of the impedance in the second position of the first actuator and to establish electrical continuity with the second actuator at the second end of the impedance in the second position of the second actuator.

5. In combination in a connector assembly for actuation by a plug,
   a hollow cover having first and second opposite ends and defining first and second barrels at least partially within the cover at the first end for receiving the plug and defining third and fourth barrels at least partially within the cover at the second end,
   first and second hollow electrically conductive shields respectively disposed within the third and fourth barrels in electrically insulated relationship to the barrels,
   first and second electrically conductive probes respectively disposed within the first and second shields in electrically insulated relationship to the shields,
   actuator means supported by the third and fourth barrels and resiliently movable between a first position providing electrical continuity between the first and second probes and between the first and second shields and a second position breaking such electrical continuity with the first probe and the first shield, and
   impedance means supported by the third and fourth barrels and disposed relative to the actuator means to establish electrical continuity with the actuator means in the second position of the actuator means to define an electrical circuit including the second probe, the impedance means and the second shield.

6. In a connector assembly as set forth in claim 5, the impedance means having first and second opposite ends,
   the actuator means including first and second actuators movable in a fixed and electrically insulated relationship to each other between the first and second positions, the first actuator being constructed to engage only the first end of the impedance means in the second position of the actuator means and the second actuator being constructed to engage only the other end of the impedance means in the second end of the impedance means.

7. In a connector assembly as set forth in claim 6, means for supporting the actuator means on the first and second barrels in insulated relationship to the first and second barrels at an intermediate position of the actuator means,
   the end portions of the actuator means defining resilient arms movable between the impedance means and individual combinations of the probes and the shields.

8. In a connector assembly as set forth in claim 7, the first actuator defining a pair of resilient arms at its opposite ends,
   the second actuator defining a pair of resilient arms at its opposite ends,
   first ones of the arms in the first and second actuators being actuatable by a plug insertable into the first barrel to move such arms into engagement with the opposite ends of the impedance means, and
   the other ones of the arms on the first and second actuators being actuatable by a plug insertable into the second barrel to move such arms into engagement with the opposite ends of the impedance means.

9. In combination in a connector assembly, a hollow cover, a first connector including the hollow cover and including a first hollow shield in the cover and a first probe in the first shield, the first shield and the first probe being disposed in an insulated relationship with respect to each other and to the cover, a second connector including the hollow cover and including a second hollow shield in the cover and a second probe in the second shield, the second shield and the second probe being disposed in an insulated relationship with respect to each other and to the cover, actuator means supported within the cover near one end of the cover and having first and second operative relationships and operative in the first relationship to establish an electrical continuity between the first and second probes and an electrical continuity between the first and second shields and operative in the second relationship to discontinue such electrical continuities with one of the probes and one of the shields, and impedance means supported with the cover near the other end of the cover and disposed relative to the actuator means for establishing an electrical circuit with the probe and the shield in an individual one of the connectors with the actuator means in the second operative relationship.

10. In a connector assembly as set forth in claim 9, the actuator means including a pair of spaced electrical conductors fixedly disposed relative to each other in an insulated relationship and having resilient properties and normally positioned to provide the first operative relationship and actuatable to establish the second operative relationship 11. In a connector assembly as set forth in claim 10, the first and second conductors being movable in a particular plane to establish the first and second operative relationships, the impedance means extending in a direction transverse to the particular plane, the first and second conductors being constructed to engage the opposite ends of the impedance means in the second operative relationship.

12. In a connector assembly as set forth in claim 11, means for fixedly attaching the actuator means to the cover near one end of the cover in insulated relationship to the cover, and means for fixedly attaching the impedance means to the cover near the other end of the cover in insulated relationship to the cover.

13. In combination in a connector assembly, first and second electrically conductive probes respectively disposed in spaced relationship, first and second electrically conductive shields respectively disposed in spaced relationship and respectively enveloping the first and second probes in spaced and electrically insulated relationship to the first and second probes, a cover enclosing the first and second shields in insulated relationship to the first and second shields, actuator means disposed in fixed and electrically insulated relationship to the cover and the first and second probes and the first and second shields and operative in first and second relationships, the actuator means being operative in the first relationship to establish an electrical continuity between the first and second probes and an electrical continuity between the first and second shields and operative in the second relationship to interrupt the electrical continuity between the first and second probes and between the first and second shields, and impedance means disposed in fixed and electrically insulated relationship to the cover and the first and second probes and the first and second shields to establish an electrical continuity of the impedance means with an individual one of the first and second probes and the corresponding one of the first and second shields in the second operative relationship of the actuator means.

14. In a connector assembly as set forth in claim 13, the actuator means having resilient properties for normal operation in the first relationship, the actuator means including first and second actuators and insulator means disposed relative to the actuators to retain the first and second actuators in fixed relationship, the cover being shaped to provide for the insertion of plugs into the cover to engage the insulator means for moving the actuator means from the first operative relationship to the second operative relationship.

15. In a connector assembly as set forth in claim 13, the actuator means being movable in a first plane between the first and second operative relationships, the impedance means being disposed in a second plane transverse to the first plane.

16. In a connector assembly as set forth in claim 14, the actuator means being movable in a first plane between the first and second operative relationships, the impedance means being disposed in a second plane transverse to the first plane and having first and second opposite ends, the first and second actuators being respectively constructed to engage the first and second opposite ends of the impedance means in the second operative relationship of the actuators.

17. In a connector assembly as set forth in claim 16, the cover being constructed to define first and second barrels for receiving the plug and for directing the plug to the insulating means on the actuator means to move the actuator means from the first operative relationship to the second operative relationship, each of the first and second actuators having first and second resilient arms, the first arms on the first and second actuators being movable, upon the insertion of the plug in the first barrel, to the position for establishing an electrical continuity between the impedance means and the second arms on the first and second actuators, the second arms on the first and second actuators being movable upon the insertion of the plug in the second barrel, to move such arms to the position for establishing an electrical continuity between the impedance means and the first arms on the first and second actuators.

18. In combination in a connector assembly, a cover defining first and second barrels near one axial end and third and fourth barrels near the opposite axial end, the first and second barrels being axially separated in the cover from the third and fourth barrels, first and second shields respectively disposed in the third and fourth barrels in electrically insulated relationship to the third and fourth barrels, first and second probes respectively disposed in the first and second shields in electrically insulated relationship to the first and second shields, actuator means supported by the first and second barrels in the space between the first and second barrels and the third and fourth barrels, the actuator means including first and second resilient actuators movable to a first operative relationship for establishing an electrical continuity between the first and second probes and an electrical continuity between the first and second shields and movable to a second operative relationship interrupting the electrical continuity between the first and second probes and the electrical continuity between the first and second shields, the first and second barrels being constructed to receive the plug to move the first and second actuators from the first operative relationship to the second operative relationship, and impedance means supported by the third and fourth barrels in the space between the first and second barrels and the third and fourth barrels for establishing an electrical continuity with the actuators moved to the second operative relationship.

19. In a connector assembly as set forth in claim 18, the actuator means including first insulating means disposed between the first and the second barrels and also including means for attaching the first insulating means to the first and second barrels and further including second insulating means disposed between the first and second actuators for maintaining the actuators in fixed relationship to each other, the second insulating means being positioned to receive the plug and to maintain the plug in electrically insulated relationship to the first and second probes and the first and second shields during the movement of the first and second actuators from the first operative relationship to the second operative relationship.

20. In a connector assembly as set forth in claim 18, the first and second actuators being movable in a particular plane between the first operative relationship and the second operative relationship, the impedance means including first insulating means disposed between the third and fourth barrels and means for attaching the first insulating means to the third and fourth barrels and the impedance means including an impedance disposed in a plane transverse to the particular plane and the first and second actuators being constructed to engage the opposite ends of the impedance in the second operative relationship of the first and second actuators.

21. In a connector assembly as set forth in claim 20, the actuator means including first insulating means disposed between the first and second barrels and also including means for attaching the first insulating means to the first and second barrels and further including second insulating means disposed between the first and second actuators for maintaining the actuators in fixed relationship to each other, the second insulating means being positioned to receive the plug and to maintain the plug in electrically insulated relationship to the first and second probes and the first and second shields during the movement of the first and second actuators from the first operative relationship to the second operative relationship.

22. In a connector assembly as set forth in claim 21, the first insulating means being attached to the first and second actuators at an intermediate position along the length of the actuators to define first and second resilient arms for the first actuator and first and second resilient arms for the second actuator, the second insulator means including third insulator means for holding the first arms of the first and second actuators in a fixed relationship to each other and fourth insulating means for holding the second arms of the first and second actuators in a fixed relationship, the probe being insertable into the first barrel to actuate the first arms of the first and second actuators into engagement with the opposite ends of the impedance and being insertable into the second barrel to actuate the second arms of the first and second actuators into engagement with the opposite ends of the impedance.

* * * * *